US009300334B2

(12) United States Patent
Lin et al.

(10) Patent No.: US 9,300,334 B2
(45) Date of Patent: Mar. 29, 2016

(54) ANTI-INTERFERENCE METHOD AND DEVICE FOR A WIRELESS COMMUNICATION SYSTEM

(71) Applicant: International Business Machines Corporation, Armonk, NY (US)

(72) Inventors: Yonghua Lin, Beijing (CN); Hang Liu, Beijing (CN); Jianbin Tang, Melbourne (AU); Jun Song Wang, Beijing (CN); Qing Wang, Beijing (CN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 135 days.

(21) Appl. No.: 14/160,637

(22) Filed: Jan. 22, 2014

(65) Prior Publication Data
US 2015/0207483 A1 Jul. 23, 2015

(51) Int. Cl.
*H04B 1/10* (2006.01)
*H03G 3/30* (2006.01)
*H04B 7/212* (2006.01)

(52) U.S. Cl.
CPC ............. *H04B 1/10* (2013.01); *H03G 3/3052* (2013.01); *H03G 3/3073* (2013.01)

(58) Field of Classification Search
CPC ....... H03G 3/3036; H03G 3/30; H03G 3/001; H03G 3/3078; H03G 3/3052; H03G 3/00; H03G 3/20; H04B 1/10; H04B 1/06; H04B 7/00; H03M 1/185; H04L 27/00
See application file for complete search history.

(56) References Cited

U.S. PATENT DOCUMENTS

| | | | |
|---|---|---|---|
| 6,798,286 B2 * | 9/2004 | Dauphinee et al. | 330/129 |
| 7,194,049 B2 * | 3/2007 | Dhalla et al. | 375/345 |
| 7,596,185 B2 | 9/2009 | Kraut et al. | |
| 7,634,244 B2 * | 12/2009 | Burns et al. | 455/240.1 |
| 7,982,541 B2 * | 7/2011 | Nakai et al. | 330/279 |
| 8,856,857 B2 * | 10/2014 | Kobayashi et al. | 725/151 |
| 9,083,567 B2 * | 7/2015 | Shi et al. | |
| 2002/0154620 A1 * | 10/2002 | Azenkot et al. | 370/347 |
| 2005/0239427 A1 * | 10/2005 | Inoue et al. | 455/232.1 |
| 2007/0197178 A1 | 8/2007 | Gu | |
| 2010/0099449 A1 | 4/2010 | Borran et al. | |
| 2010/0110999 A1 | 5/2010 | Li et al. | |

(Continued)

FOREIGN PATENT DOCUMENTS

WO WO2012/061383 5/2012

OTHER PUBLICATIONS

Huang, et al., Performance Evaluation of Various Network Assisted Based Power, Packet and Spreading Gain Control Scheme from DS-CDMA Based Wireless Data System, VTC 2002-Fall.
Kasparick, et al., Autonomous Distributed Power Control Algorithms for Interference Mitigation in Multi-Antenna Cellular Networks, Wireless Conference 2011, Apr. 27, pp. 1-8.

(Continued)

*Primary Examiner* — Pablo Tran
(74) *Attorney, Agent, or Firm* — Jeff Tang

(57) ABSTRACT

An anti-interference method and device for a wireless communication system. The method includes: receiving a RF signal; analyzing the RF signal to obtain the power variation characteristic of the RF signal; and determining a gain control method according to the power variation characteristic of the RF signal. The anti-interference methods and devices according to the embodiments of the present invention can ensure the communication quality of the wireless communication system in a case that there is strong burst interference.

2 Claims, 6 Drawing Sheets

(56) References Cited

U.S. PATENT DOCUMENTS

2010/0227637 A1 9/2010 Kwon et al.
2013/0335146 A1* 12/2013 Takahashi et al. ............ 330/279

OTHER PUBLICATIONS

Chamberland, et al., Decentralized Dynamic Power Control for Cellular CDMA Systems, IEEE Transactions on Wireless Comm, vol. 2, No. 3, May 2003.

* cited by examiner

ANTI-INTERFERENCE METHOD AND DEVICE FOR A WIRELESS COMMUNICATION SYSTEM

BACKGROUND OF THE INVENTION

The present invention relates to a wireless communication system. More specifically, the present invention relates to an anti-interference method and device for a wireless communication system.

A wireless communication system consists of three parts (i.e., a transmitting apparatus, receiving apparatus, and radio channel) and utilizes radio waves to communicate information and data. Wireless communication is widely used because of the great convenience of the communication thereof. Cellular networking became a main networking method for wireless communication because of good coverage, reasonable networking cost, and high utility efficiency of frequency spectrum resources thereof. In the cellular networking, a base station is the center of a cell and needs to communicate with all the terminals in the cell. Since the distance between the base station and each terminal is different, the modulation mode of each terminal is different, and the strength of the signal received in the base station is different, the base station should have a wide receiving dynamic range. In order to ensure that signals from different terminals can be received correctly, a conventional base station mainly works in the following way:

1. An Analogue to Digital Converter (ADC) with a wide bit-width is used. Generally speaking, an ADC with 12 bits or more is a good choice. However, since the cost of a high rate ADC with 12 bits or more is high, an ADC with 11 bits is widely used in practice.
2. The Automatic Gain Control (AGC) is used to adjust the gain of a receiver of the base station. The AGC technology is one of the most important technologies for a communication receiving apparatus. Because of the limitation of the number of bits of the ADC, it is not possible to provide a very wide receiving dynamic range merely by means of the ADC. Therefore, in order to further increase the dynamic range of the receiver, the AGC technology is generally needed at the receiver side. The main function of the AGC is to maintain the level of the signal output from a front end radio frequency amplifying circuit at a certain value when the signal arrives at the ADC. The AGC can automatically ensure that the front end variable gain amplifier is in a high gain position upon reception of a weak signal, while the front end variable gain amplifier is in a low gain position upon reception of a strong signal, so that the output signal is maintained at a proper level. Therefore, the following cases can be avoided: where the input signal is too small to ensure the accuracy of the output of the ADC or where the input signal is too large, which saturates the ADC to distort the signal.
3. The Power Control technology is used. The transmitting power of each terminal is adjusted so that the strength of a signal that arrives at the base station from each terminal is in a relatively close range. Thereby, it is possible to reduce the requirement on the dynamic range of the base station. On the premise that the communication quality is ensured, the power control will make the transmitting power as small as possible. Therefore, the power control technology can save the power consumption of a terminal. Meanwhile, it is also possible to reduce the mutual interference between terminals.

The effects of these technologies applied to a conventional base station are very good because there is no interference from other wireless systems. However, since radio spectra become rare, it becomes increasingly urgent to share radio spectrum resources. When radio spectrum resources are shared, interference from a heterogeneous system is inevitable. In the Industrial Scientific Medical (ISM) frequency bands, which are mainly used for industrial, scientific, and medical organizations, no license is needed and it is only necessary to comply with a certain transmitting power (generally lower than 1 W) and not to interfere with other frequency bands. In the ISM frequency bands, the 2.4 GHz frequency band is an ISM frequency band commonly used by many countries. Many different wireless communication systems coexist (e.g., WIFI, Bluetooth, Zigbee, etc). These communication systems cannot work at the same time because they occupy wide bandwidths and cause strong interference with each other. They can share frequency spectra only by using a back-off method. For a new broadband system, all in-band signals from heterogeneous systems are considered interference signals. Most narrow band signals have a very strong power spectrum density, while broadband signals have low power spectrum density and are susceptible to interference from narrow band signals and thus cannot work normally. Therefore, the coexistence of broadband signals and narrow band signals becomes a big challenge.

The conventional gain control technology does not consider the factor of heterogeneous interference. In the case of strong burst interference, the ADC can be saturated easily and introduce a large error, so that uplink signals cannot be decoded. Additionally, since real signal power can not be estimated correctly in the case of the saturated ADC, the adjustment step of the gain control is not accurate. As a result, it takes a long time to achieve an accurate adjustment. However, since the interference comes suddenly, there is often a difficult situation: when the AGC catches up with the change in the signal, the interference disappears. At this point, the AGC can return to be in the range of a normal signal after some adjustment steps. These adjustments are often accompanied by a large number of error codes. If the AGC is simply set to correspond to the strongest interference, the overall noise coefficient of the system will increase significantly so that the terminal has to transmit higher uplink transmitting power for normal communication. As a result, the coverage of the whole system is reduced significantly.

For a new broadband system, all in-band signals from heterogeneous systems are considered interference signals. Most narrow band signals have very strong power spectrum density, while broadband signals have low power spectrum density and are susceptible to interference from narrow band signals and thus cannot work normally. The conventional power control technology does not consider the factor of heterogeneous interference and thus is not applicable any longer.

Therefore, it is desirable to provide an anti-interference method of a wireless communication system, which is able to ensure the communication quality of the wireless communication system in the case that there is strong burst interference.

SUMMARY OF THE INVENTION

Accordingly, one aspect of the present invention is a computer implemented method for anti-interference for a wireless communication system, wherein the computer includes a processor communicatively coupled to a memory, the method including the steps of: receiving a RF signal; analyzing the RF signal to obtain the power variation characteristic of the RF signal; and determining a gain control method according to the power variation characteristic of the RF signal.

Another aspect of the present invention is a computer implemented method for anti-interference for a wireless communication system, wherein the computer includes a processor communicatively coupled to a memory, the method including the steps of: acquiring a baseband signal of a RF signal; calculating the interference noise power of the baseband signal; and setting a power control level according to the interference noise power.

Another aspect of the present invention is an anti-interference device for a wireless communication system, including: a receiving module configured to receive a RF signal; an analyzing module configured to analyze the RF signal to obtain the power variation characteristic of the RF signal; and a determining module configured to determine a gain control method according to the power variation characteristic of the RF signal.

Another aspect of the present invention is an anti-interference device for a wireless communication system, including: a baseband signal acquiring module configured to acquire a baseband signal of a RF signal; an interference noise power calculating module configured to calculate the interference noise power of the baseband signal; and a power control level setting module configured to determine a power control level according to the interference noise power.

The anti-interference methods and devices for the wireless communication system according to the embodiments of the present invention are capable of ensuring the communication quality of the wireless communication system in the case that there is strong burst interference.

DETAILED DESCRIPTION OF THE PREFERRED EMBODIMENT

Figure 1:
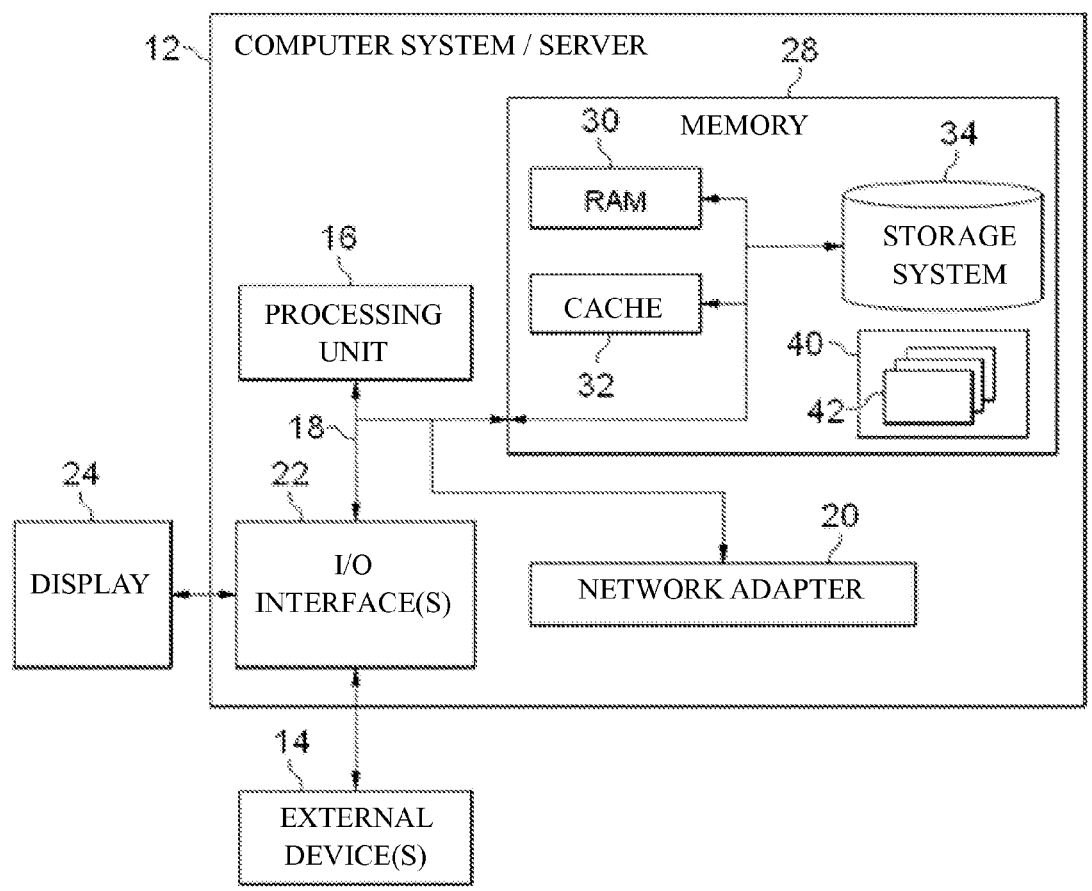
FIG. 1 shows a block diagram of an exemplary computer system/server which is applicable to implement the embodiments of the present invention.

Some preferable embodiments will be described in more detail with reference to the accompanying drawings, in which the preferable embodiments of the present disclosure have been illustrated. However, the present disclosure can be implemented in various manners and, thus, should not be construed to be limited to the embodiments disclosed herein. On the contrary, those embodiments are provided for the thorough and complete understanding of the present disclosure and completely conveying the scope of the present disclosure to those skilled in the art. The same reference generally refers to the same components in the exemplary embodiments of the present disclosure.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.), or an embodiment combining software and hardware aspects that can all generally be referred to herein as a "circuit," "module" or "system." Furthermore, aspects of the present invention can take the form of a computer program product embodied in one or more computer readable medium(s) having computer readable program code embodied thereon.

Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electro-magnetic, optical, or any suitable combination thereof. A computer readable signal medium can be any computer readable medium that is not a computer readable storage medium and that can communicate, propagate, or transport a program for use by or in connection with an instruction execution system, apparatus, or device.

Program code embodied on a computer readable medium can be transmitted using any appropriate medium, including but not limited to wireless, wireline, optical fiber cable, RF, etc., or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the user's computer, partly on the user's computer, as a stand-alone software package, partly on the user's computer and partly on a remote computer, or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider).

Aspects of the present invention are described below with reference to flowchart illustrations and/or block diagrams of methods, apparatus (systems,) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer readable medium that can direct a computer, other programmable data processing apparatus, or other devices to function in a particular manner, such that the instructions stored in the computer readable medium produce an article of manufacture including instructions means which implement the function/act specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring to FIG. 1, FIG. 1 shows a block diagram of an exemplary computer system/server 12, which is applicable to implement the embodiments of the present invention. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 can include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media can be any available media that is accessible by computer system/server 12 and it includes both volatile and non-volatile media, removable and non-removable media.

System memory 28 can include computer system readable media in the form of volatile memory, such as random access memory (RAM) 30 and/or cache memory 32. Computer system/server 12 can further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk") and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 can include at least one program product having a set (e.g., at least one) of program modules that are configured to carry out the functions of embodiments of the invention.

Program/utility 40, having a set (at least one) of program modules 42, can be stored in memory 28 by way of example, and not limitation, as well as an operating system, one or more application programs, other program modules, and program data. Each of the operating system, one or more application programs, other program modules, and program data or some combination thereof, can include an implementation of a networking environment. Program modules 42 generally carry out the functions and/or methodologies of embodiments of the invention as described herein.

Computer system/server 12 can also communicate with one or more external devices 14 (such as a keyboard, a pointing device, a display 24, etc.), one or more devices that enable a user to interact with computer system/server 12, and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to, microcode, device drivers, redundant processing units, external disk drive arrays, RAID systems, tape drives, and data archival storage systems, etc.

Figure 2:
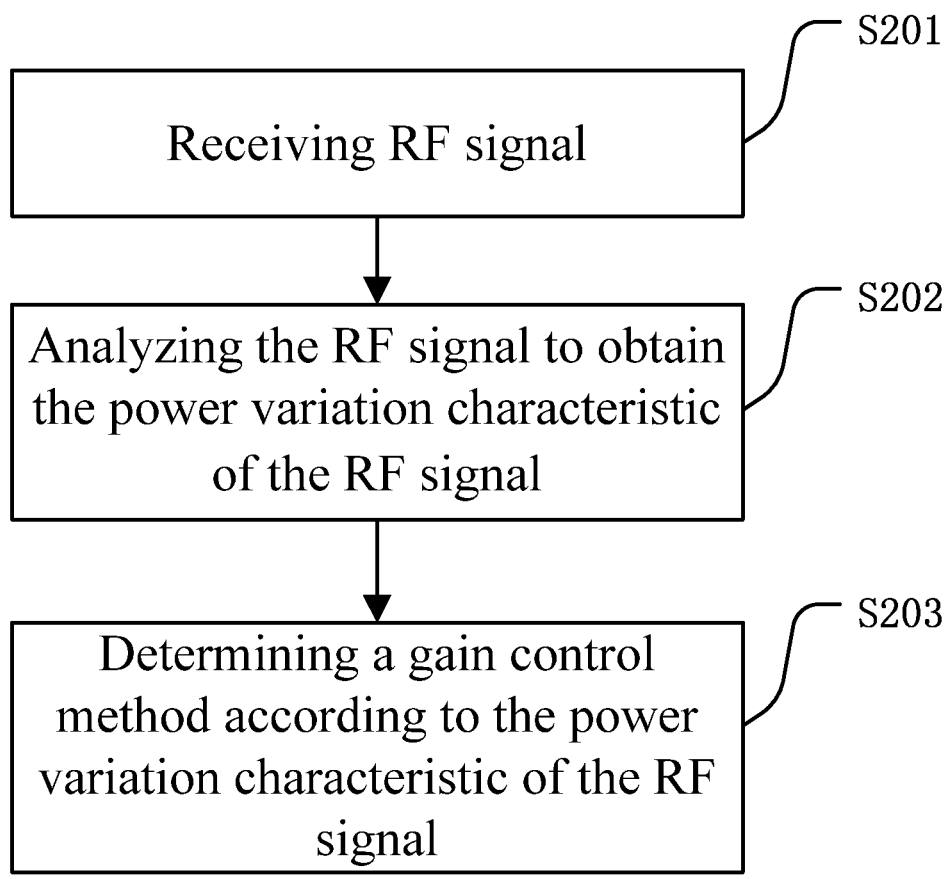
FIG. 2 shows an interference processing method of a wireless communication system according to one embodiment of the present invention.

Referring to FIG. 2, FIG. 2 shows an interference processing method of a wireless communication system according to one embodiment of the present invention. The method includes: in step S201, a RF signal is received; in step S202, the RF signal is analyzed to obtain the power variation characteristic of said RF signal; and in step S203, a gain control method is determined according to the power variation characteristic of the RF signal.

The gain control method includes the Automatic Gain Control (AGC) and the Fixed Gain Control (FGC). The AGC means that a Radio Unit (RU) adaptively adjusts the gain according to the RF signal being strong or weak. The FGC means that a Baseband Unit (BBU) specifies that the RU uses a fixed gain and the gain does not vary according to the RF signal being strong or weak.

In the wireless communication system, the base station includes the BBU and the RU, wherein the RU includes a RF front end, an ADC, a digital down converter and RF power detector. The RF power detector positioned after the ADC first calculates the digital domain power of the digital signal after the ADC and compares the detected digital domain power with a preset target digital domain power. If the detected digital domain power is larger than the target digital domain power, it indicates that the gain of the RF front end is too large. Therefore, the gain of the variable gain amplifier of the RF front end will be reduced. If the detected digital domain power is smaller than the target digital domain power, it indicates that the gain of the RF front end is too small. Therefore, the gain of the variable gain amplifier of the RF front end will be increased. Continuously, through the above mentioned close loop control, the detected digital domain power is controlled to be within the target digital domain power range. The AGC is directly accomplished by the RU. Considering a case that, when there is burst interference, the AGC tends to be affected by the interference and the system performance is affected. Therefore, in this case, the FGC has a better performance. So, it is possible to effectively improve the system performance by employing the AGC or the FGC according to the situation.

In step S201, the RF signal is received by the RU and the ADC samples the RF signal and sends the sampled signal to a digital processing unit of the RU. Generally, the RU is responsible for the gain control in a conventional base station and its function is simple. In order to adjust the strategy of the gain control more flexibly and also utilize the strong processing capability and flexible programming capability of the BBU at the same time, a signal for switching the AGC and the FGC and a fixed gain value configuring signal are defined between the RU and the BBU. The RU can transmit the sampled RF signal to the BBU. The RU can transmit information of the RF signal (e.g., the RF signal level, the maximum RF signal level, the average RF signal level, etc.) to the BBU. Meanwhile, the BBU can send an AGC control instruction or a FGC control instruction to the RF power detector of the RU. These newly defined signals and messages are very critical and essential for the BBU to efficiently acquire information of the RF signal and control the RU flexibly.

Various embodiments can be employed to analyze the RF signal to obtain the power variation characteristic of the RF signal in step S202 and to select a gain control method according to the power variation characteristic of the RF signal in step S203.

According to one embodiment of the present invention, the power variation characteristic of the RF signal includes the ratio of the maximum RF signal level (MRL) to the average RF signal level (ARL). Specifically, the MRL and the ARL of the RF signal are acquired, the ratio of the MRL to the ARL is calculated, and the ratio is compared with a first threshold value. In response to the ratio being less than the first threshold value, the AGC is enabled, and in response to the ratio being larger than or equal to the first threshold value, the FGC is enabled and the gain is set according the MRL. The RU acquires the RF signal levels $P_{ti}$ at time ti (i=1 ... n). The BBU acquires the RF signal levels $P_{ti}$ (i=1 ... n) from the RU, compares the RF signal levels $P_{ti}$ (i=1 ... n) to obtain the MRL where MRL=Max $P_{ti}$ (i=1 ... n), and calculates the average of the RF signal levels $P_{ti}$ (i=1 ... n) to obtain the ARL, where $$ARL = \frac{\sum_{i=1}^{n} P_{ti}}{n}.$$

Figure 3:
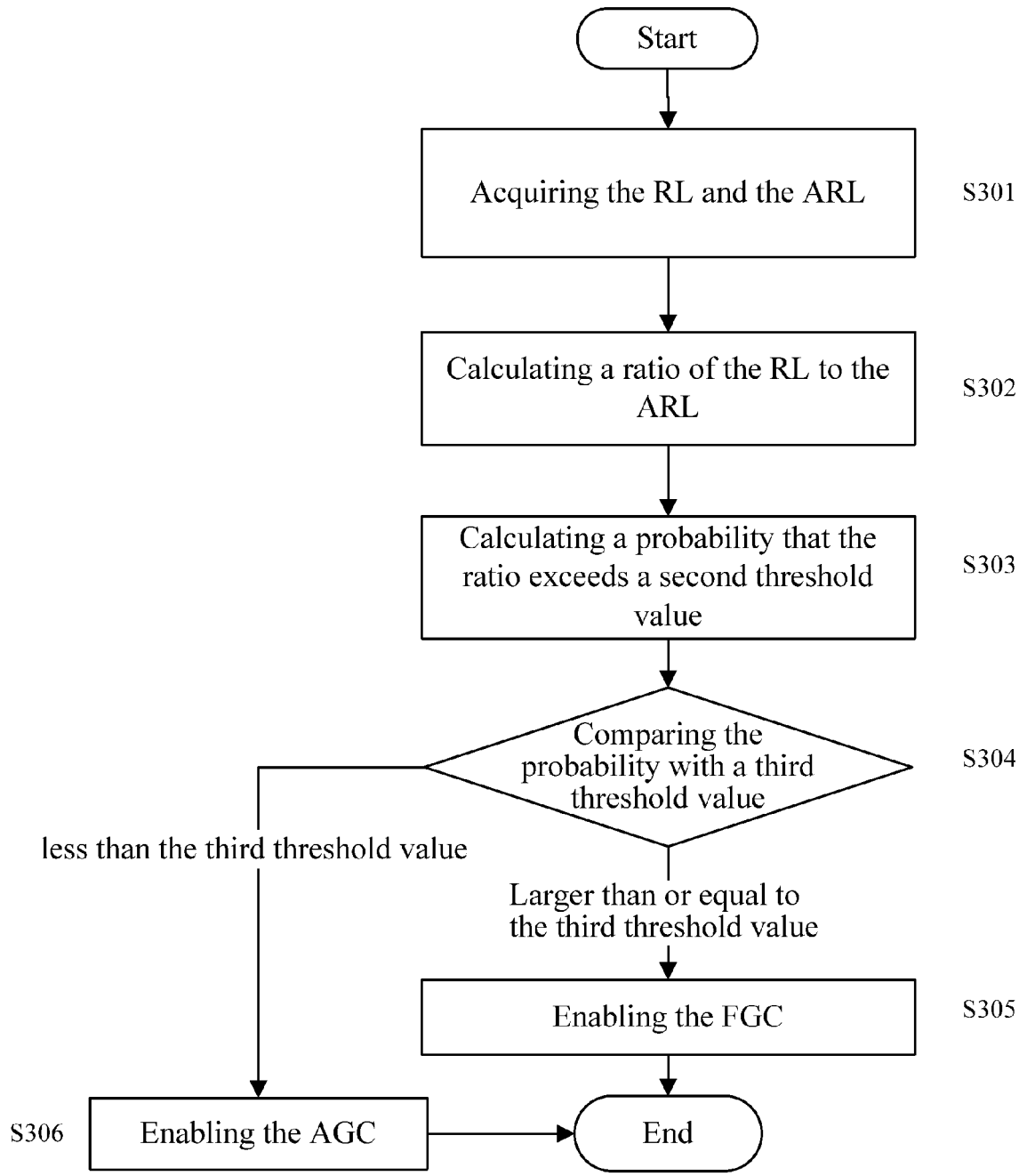
FIG. 3 shows a flowchart of selecting a gain control method according to a ratio of a Radio Frequency (RF) signal level and an average RF signal level according to one embodiment of the present invention.

According to one embodiment of the present invention, the power variation characteristic of the RF signal includes the ratio of the RF signal level (RL) to the average RF signal level (ARL). Referring to FIG. 3, FIG. 3 shows a flowchart for selecting a gain control method according to the ratio of the RL and the ARL according to one embodiment of the present invention. In step S301, the RL and the ARL of the RF signal are acquired. Specifically, the RL $P_{ti}$ at time ti (i=1 ... n) are acquired and the average of the RL $P_{ti}$ (i=1 ... n) is calculated to obtain the ARL, wherein the method of acquiring the RL and the ARL refers to the above embodiment, which is not repeated here. In step S302, the ratio of the RL to the ARL is calculated. In step S303, a probability that the ratio is larger than a second threshold value is calculated. That is, the ratio is compared with the second threshold value. The ratio being larger than the second threshold value means that the RF signal will saturate the ADC and the number of times that the ratio exceeds the second threshold value is recorded, and the ratio of the number of times that the ratio exceeds the second threshold value to a total number of times is calculated. In step S304, the probability is compared with a third threshold value. In response to the probability being less than the third threshold value, the AGC is enabled in step S306, and the process ends. In response to the probability being larger than or equal to the third threshold value, the FGC is enabled in step S305. According to an embodiment of the present invention, in a case where the FGC is enabled, the gain can be further determined according to the probability. Specifically, the probability is compared with a fourth threshold value. In response to the probability being less than the fourth threshold value, the gain is set according to the ARL. At this time, because the error rate resulting from an interference signal is acceptable, a scheme in which a fixed appropriate ARL is utilized can maximize the capacity and the coverage of the system. In response to the probability being larger than or equal to the fourth threshold value, the gain is set according to the MRL.

According to one embodiment of the present invention, the power variation characteristic of the RF signal includes the variance of the RF signal (VRL). Specifically, the VRL of the RF signals is acquired and compared with a fifth threshold value. In response to the VRL being less than or equal to the fifth threshold value, the AGC is enabled. In response to the VRL being larger than the fifth threshold value, the FGC is enabled, and the gain is set according to the MRL. The RU acquires the RL $P_{ti}$ at time ti (i=1 ... n). The BBU acquires the RL $P_{ti}$ (i=1 ... n) from the RU, where $$VRL = \frac{1}{n}\sum_{i=1}^{n}\left[P_{ti} - \frac{1}{n}\sum_{i=1}^{n} P_{ti}\right]^2.$$

Those skilled in the art can understand that, in addition to the above methods, there can be various technical schemes for obtaining the power variation characteristic of the RF signal and determining a gain control method according to the power variation characteristic of the RF signal, which fall into the protection scope of the present invention.

According to an embodiment of the present invention, the anti-interference can also be achieved by controlling the power control level. The power control level indicates a base value of an expected power of a signal that arrives at a base station from a terminal, which combining with the carrier to interference noise ratio necessary for different modulation methods and the margin, to obtain the expected power value of the signal that arrives at the base station from the terminal to direct the optimal real transmitting power of the terminal. The conventional power control technology does not consider the factor of heterogeneous interference and thus is not applicable. If there is no interference, the transmitting power of the terminal=noise floor of the base station+path loss+carrier to interference noise ratio of a specified modulation method+ margin. However, if there is burst interference, the noise floor of the base station is no longer the thermal noise plus noises caused by electronic components of the RU and the varying interference becomes a main source of the noise floor. If a conventional power control level is maintained, the ADC can be saturated easily and introduce large errors so that uplink signals cannot be decoded. The energy efficiency of the terminal and the coverage of the system will be reduced significantly. The power control method according to an embodiment of the present invention adjusts the transmitting power of the terminal to be: the transmitting power of the terminal=power control level of the base station+path loss+ carrier to interference noise ratio of a specified modulation method+margin. This avoids the uncertainty of the noise floor caused by interference and the energy efficiency of the terminal and the coverage of the system are made to be in an optimal balance.

Figure 4:
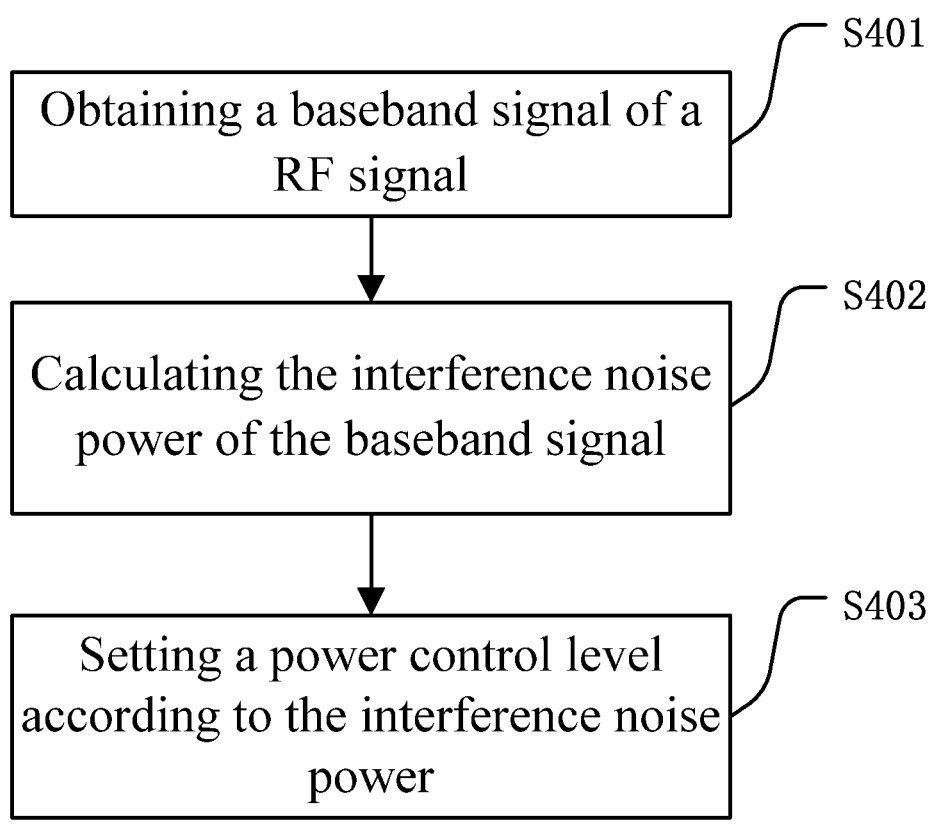
FIG. 4 shows an interference processing method of a wireless communication system according to one embodiment of the present invention.

Referring to FIG. 4, FIG. 4 shows an interference processing method of a wireless communication system according to one embodiment of the present invention. The method includes: in step S401, a baseband signal of a RF signal is acquired; in step S402, the interference noise power of the baseband signal is calculated; and in step S403, a power control level is set according to the interference noise power.

It is noted that the gain control method and the power control level control method according to embodiments of the present invention can be used separately to achieve the anti-interference of the wireless communication system, or can be used in combination. No matter these methods are used separately or in combination, the purpose of anti-interference of the present invention can be achieved. In a case where these two methods are used in combination, while large errors are reduced, the uncertainty of the noise floor caused by interference is avoided, thereby ensuring the communication of the wireless communication system better.

According to one embodiment of the present invention, the interference noise power of the baseband signal can be the maximum interference noise power (MNP) of the baseband signal, and the MNP is set to be the power control level. Although the method can obtain a good error code performance, it will reduce the coverage of the system. The RU acquires the interference noise power of the baseband signal $P_{bti}$ at time ti (i=1 ... n). The BBU acquires the interference noise power of the baseband signal $P_{bti}$ (i=1 ... n) from the RU, and compares the interference noise power of the baseband signal $P_{bti}$ (i=1 ... n) to obtain the MNP where MNP=Max $P_{bti}$ (i=1 ... n).

According to one embodiment of the present invention, the interference noise power of the baseband signal can be the average interference noise power (ANP) of the baseband signal and the ANP is set to be the power control level. The RU acquires the interference noise power of the baseband signal $P_{bti}$ at time ti (i=1 ... n). The BBU acquires the interference noise power of the baseband signal $P_{bti}$, ti (i=1 ... n) from the RU and calculates the average of the interference noise power of the baseband signal $P_{bti}$, ti (i=1 ... n) to obtain the ANP of the baseband signal where $$ANP = \frac{\sum_{i=1}^{n} P_{bti}}{n}.$$

Although there are certain bit errors in the method, the bit errors are within an acceptable bit error range, which can effectively improve the coverage and the capacity of the system.

According to one embodiment of the present invention, the method further includes calculating the ANP of the baseband signal, wherein setting the power control level according to the interference noise power includes determining the power control level according to a ratio of the interference noise power and the ANP.

Figure 5:
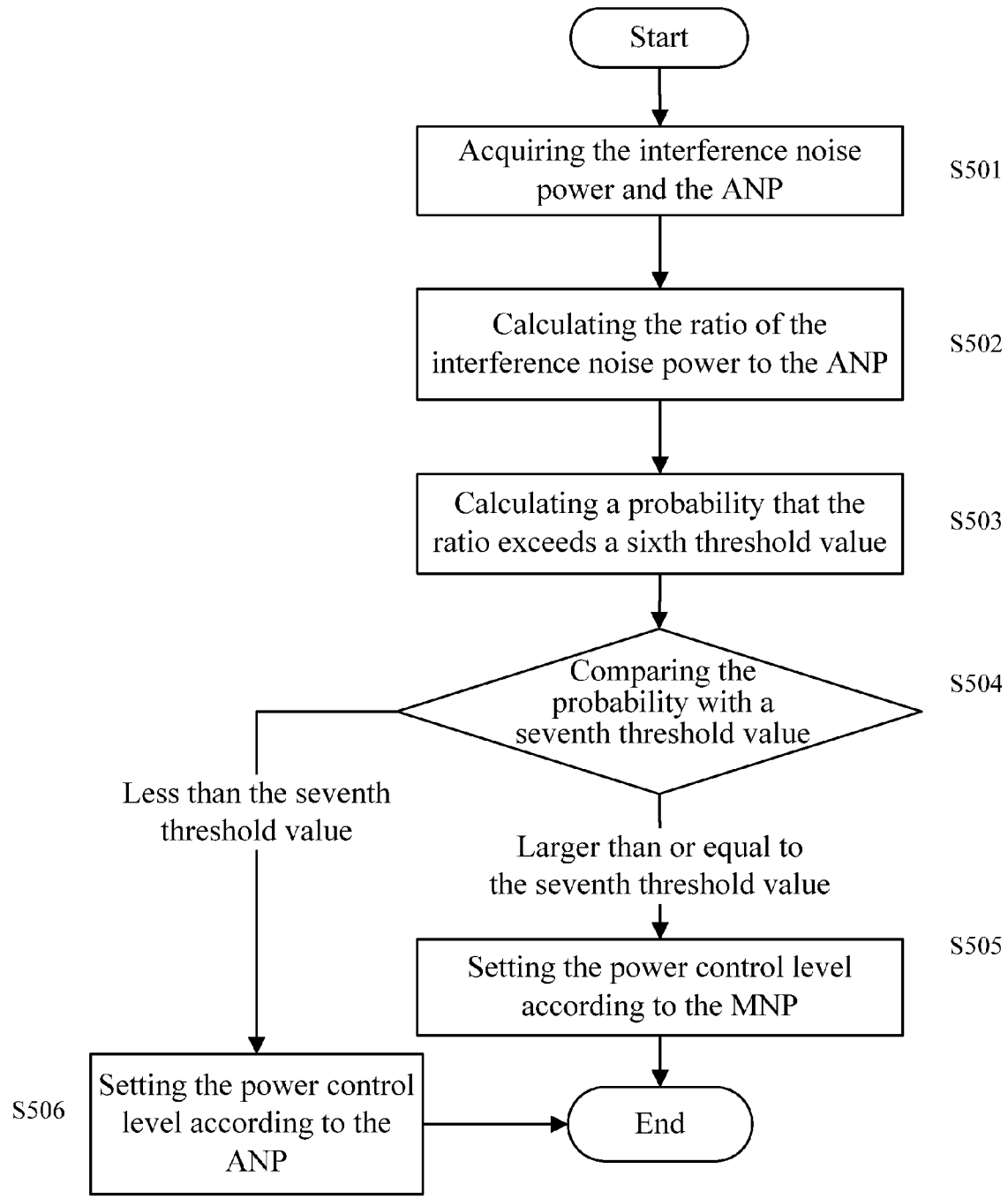
FIG. 5 shows a flowchart of determining a power control level according to a ratio of an interference noise power and an average interference noise power according to one embodiment of the present invention.

Referring to FIG. 5, FIG. 5 shows a flowchart of determining a power control level according to the ratio of the interference noise power and the ANP according to an embodiment of the present invention. In step S501, the interference noise power and the ANP of the baseband signal are acquired. Specifically, the interference noise power of the baseband signal $P_{bti}$ at time ti (i=1 ... n) are acquired and the average of the interference noise power of the baseband signal $P_{bti}$ (i=1 ... n) is calculated to obtain the ANP, wherein the method of acquiring the interference noise power and the ANP of the baseband signal refers to the above embodiment. In step S502, the ratio of the interference noise power to the ANP is calculated. In step S503, a probability that the ratio exceeds a sixth threshold value is calculated. That is, the ratio is compared with the sixth threshold value. The number of times that the ratio exceeds the sixth threshold value is recorded. And the ratio of the number of times that the ratio exceeds the sixth threshold value to a total number of times is calculated. In step S504, the probability is compared with a seventh threshold value. In response to the probability being larger than or equal to the seventh threshold value, which means the interference occurs frequently, in step S505, the power control level is set according to the MNP and the process ends. In response to the probability being less than the seventh threshold value, which means the probability that strong interference occurs is low and at this time the resultant error rate is in an acceptable range, in step S506, the power control level is set according to the ANP, thereby obtaining the optimal capacity and coverage of the system and the process ends.

Those skilled in the art can understand that, in addition to the methods in the above embodiments, there can be various technical schemes for obtaining certain the power control level of the baseband signal and setting the power control level according to said interference noise power, which fall into the protection scope of the present invention.

Meanwhile, since the interference signal from a heterogeneous system often varies, it is necessary to analyze the power variation characteristic of the interference noise signal continuously and adjust the power control scheme according to the power variation characteristic in real time, during the operation of the broadband wireless communication system. An embodiment of analyzing the RF interference signal continuously is as follows below.

According to one embodiment of the present invention, through the resource scheduling at the base station, the system can reserve a time window regularly or irregularly, at which none of the terminals send signals and the base station utilizes the time window to obtain the interference noise signal.

According to one embodiment of the present invention, in order to reduce the influence on the broadband communication system, the base station can directly analyze the signal and the interference. Since the base station system has sufficient information on its own signals, it can easily separate the interference noise signal from the baseband signal and calculate the interference noise power of said interference noise signal.

According to one embodiment of the present invention, in order to reduce the influence on the broadband communication system, with respect to a Time Division Duplex (TDD) system, the guard interval between the downlink signal and the uplink signal can be used to obtain the interference noise signal.

Figure 6:
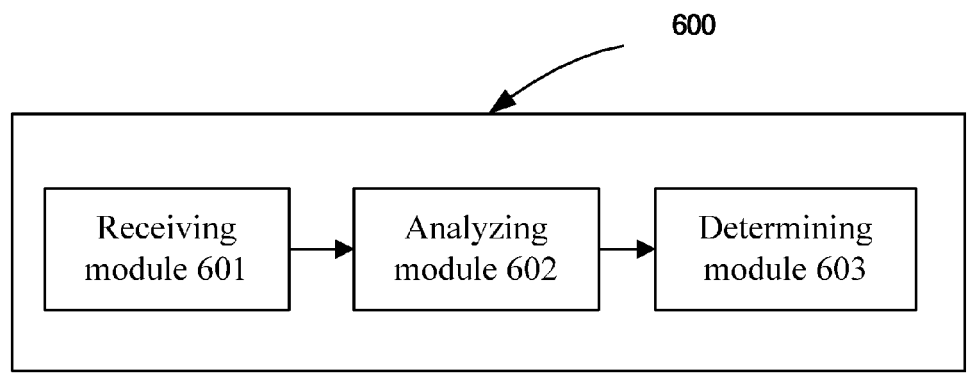
FIG. 6 shows an anti-interference device of a wireless communication system according to one embodiment of the present invention.

Based on the same inventive concept, the present invention proposes an anti-interference device of a wireless communication system. Referring to FIG. 6, FIG. 6 shows an anti-interference device 600 of a wireless communication system according to an embodiment of the present invention. The anti-interference device 600 including: a receiving module 601 configured to receive a RF signal; an analyzing module 602 configured to analyze the RF signal to obtain the power variation characteristic of the RF signal; and a determining module 603 configured to determine a gain control method according to the power variation characteristic of the RF signal. The device can be implemented by the base station, wherein the receiving module 601 is implemented by the RU and the analyzing module 602 and the determining module 603 can be implemented in the BBU. Those skilled in the art should understand that modules 601-603 in the device 600 correspond to steps 201-203 in the method shown in FIG. 2 respectively. Details are not repeated here.

According to an embodiment of the present invention, the power variation characteristic of the RF signal includes the ratio of the MRL to the ARL. The analyzing module 602 includes: a first acquiring module configured to acquire the MRL and the ARL of the RF signal; and a first calculating module configured to calculate the ratio of the MRL to the ARL. The determining module 603 includes: a first comparing module configured to compare the ratio with a first threshold value; a first AGC module configured to, in response to the ratio being less than the first threshold value, enable the AGC; and a first FGC module configured to, in response to the ratio being larger than or equal to the first threshold value, enable the FGC.

According to an embodiment of the present invention, the power variation characteristic of the RF signal includes the ratio of the RL to the ARL. The analyzing module 602 includes: a second acquiring module configured to acquire the RL and the ARL of the RF signal; and a second calculating module configured to calculate the ratio of the RL to the ARL of the RF signal. The determining module 603 includes: a third calculating module configured to calculate a probability that the ratio exceeds a second threshold value; a second comparing module configured to compare the probability with a third threshold value; a second AGC module configured to, in response to the probability being less than the third threshold value, enable the AGC; and a second FGC module configured to, in response to the probability being larger than or equal to the third threshold value, enable the FGC. The second FGC module further includes: a third comparing module configured to compare the probability with a fourth threshold value; a gain setting module configured to, in response to the probability being less than the fourth threshold value, set the gain according to the ARL, and in response to the probability being larger than or equal to the fourth threshold value, set the gain according to the MRL.

According to an embodiment of the present invention, the power variation characteristic of the RF signal includes the VRL of the RF signal. The analyzing module 602 includes: a third acquiring module configured to acquire the VRL of the RF signal. The determining module 603 includes: a fourth comparing module configured to compare the VRL of the RF signal with a fifth threshold value; a third AGC module configured to, in response to the VRL of the RF signal being less than or equal to the fifth threshold value, enable the AGC; and a third FGC module configured to, in response to the VRL of the RF signal being larger than the fifth threshold value, enable the FGC.

Figure 7:
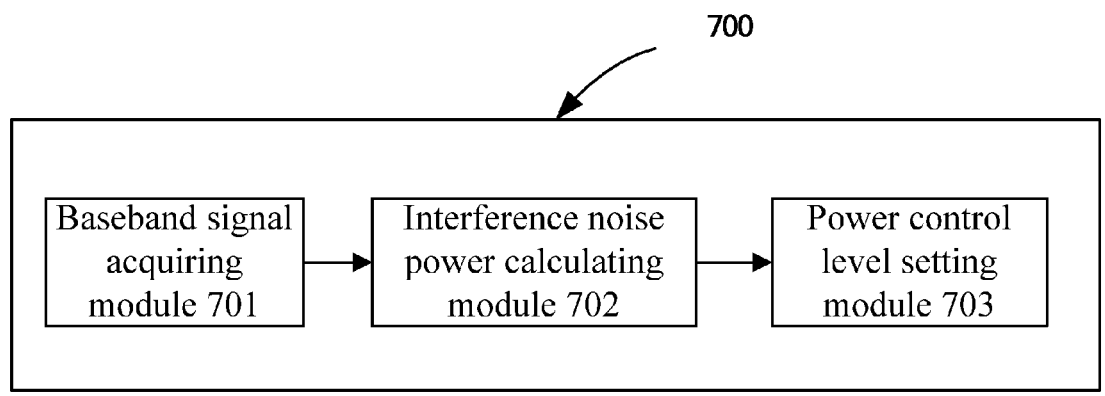
FIG. 7 shows an anti-interference device of a wireless communication system according to one embodiment of the present invention.

The present invention also proposes an anti-interference device 700 of a wireless communication system according to an embodiment of the present invention. Referring to FIG. 7, FIG. 7 shows an anti-interference device 700 of a wireless communication system according to one embodiment of the present invention. The anti-interference device 700 includes: a baseband signal acquiring module 701 configured to acquire the baseband signal of the RF signal; an interference noise power calculating module 702 configured to calculate the interference noise power of the baseband signal; and a power control level setting module 703 configured to determine a power control level according to the interference noise power. The device can be implemented by the base station, wherein the baseband signal acquiring module 701 is implemented by the RU and the interference noise power calculating module 702 and the power control level setting module 703 can be implemented in the BBU. Those skilled in the art should understand that modules 701-703 in the device 700 correspond to steps 401-403 in the method shown in FIG. 4 respectively. Details are not repeated here.

According to an embodiment of the present invention, the interference noise power of the baseband signal is the MNP of the baseband signal. The power control level setting module 703 is configured to set the MNP to be the power control level.

According to an embodiment of the present invention, the interference noise power of the baseband signal can be the ANP of the baseband signal. The power control level setting module 703 is configured to set the ANP to be the power control level.

According to an embodiment of the present invention, the interference noise power calculating module is further configured to calculate the ANP of the baseband signal. The power control level setting module is further configured to determine the power control level according to the ratio of the interference noise power and the ANP.

According to an embodiment of the present invention, the interference noise power calculating module is further configured to calculate the ratio of the interference noise power and the ANP, and calculate a probability that the ratio exceeds a sixth threshold value. The power control level setting module is further configured to compare the ratio with a seventh threshold value and, in response to the probability being less than the seventh threshold value, set the ANP to be the power control level and, in response to the probability being larger than or equal to the seventh threshold value, set the MNP to be the power control level.

According to an embodiment of the present invention, the interference noise power calculating module is configured to separate the RF interference signal from the RF signal and analyze the power variation characteristic of the RF interference signal.

The flowchart and block diagrams in the Figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A computer implemented method for anti-interference for a wireless communication system, wherein the computer includes a processor communicatively coupled to a memory, the method comprising the steps of:

receiving a RF signal;

analyzing said RF signal to obtain the power variation characteristic of said RF signal; and determining a gain control method according to the power variation characteristic of said RF signal;

wherein analyzing said RF signal to obtain the power variation characteristic of said RF signal comprises: acquiring the maximum RF signal level and the average RF signal level of said RF signal; and calculating the ration of the maximum RF signal level to the average RF signal level; and wherein determining a gain control method according to the power variation characteristic of said RF signal comprises: comparing said ratio with a first threshold value; and in response to said ratio being less than the first threshold value enabling the Auto Gain Control (AGC), and in response to said ratio being larger than or equal to the first threshold value enabling the Fixed Gain control (FGC).

2. An anti-interference device for a wireless communication system, comprising:

a receiving module configured to receive a RF signal;

an analyzing module configured to analyze said RF signal to obtain the power variation characteristic of said RF signal; and a determining module configured to determine a gain control method according to the power variation characteristic of said RF signal wherein the analyzing module comprises: a first acquiring module configured to acquire the maximum RF signal level and the average RF signal level of said RF signal; and a first calculating module configured to calculate a ratio of the maximum RF signal level to the average RF signal level; and wherein the determining module comprises: a first comparing module configured to compare said ratio with a first threshold value; a first Auto Gain Control (AGC) module configured to, in response to said ratio being less than the first threshold value, enable the AGC; and a first Fixed Gain Control (FGC) module configured to, in response to said ratio being larger than or equal to the first threshold value, enable the FGC.

* * * * *